United States Patent [19]

Holland

[11] 4,237,427
[45] Dec. 2, 1980

[54] APPARATUS FOR STABILIZING A LASER
[75] Inventor: John M. Holland, Shawsville, Va.
[73] Assignee: International Telephone and Telegraph Corporation, New York, N.Y.
[21] Appl. No.: 916,399
[22] Filed: Jun. 16, 1978
[51] Int. Cl.³ .............................................. H01S 3/13
[52] U.S. Cl. ............................ 331/94.5 S; 331/94.5 H
[58] Field of Search ........................ 331/94.5 H, 94.5 S; 357/18, 19

[56] References Cited

U.S. PATENT DOCUMENTS

| 3,946,335 | 3/1976 | De Loach, Jr. et al. | 331/94.5 S |
| 4,109,217 | 8/1978 | Brackett et al. | 331/94.5 S |

Primary Examiner—William L. Sikes
Attorney, Agent, or Firm—John T. O'Halloran; Peter C. Van Der Sluys

[57] ABSTRACT

A laser stabilizing apparatus employs two feedback control loops. One control loop serves to monitor the light intensity output of the laser and provides an error output signal which is compared with a reference signal to develop a control signal that is integrated and used to control the output level of the laser diode during normal operation. In such operation, the laser diode is modulated according to an input signal which possesses a balanced duty factor. If the duty factor of this signal becomes imbalanced, a second control loop detects the imbalance and operates via the integrator to turn the laser diode off to thus prevent facet damage. The circuitry described operates at a substantial power saving due to the fact that there is no prebias current applied to the laser and hence, the laser operates between a conducting and nonconducting mode and under control of the above described loops.

10 Claims, 2 Drawing Figures

APPARATUS FOR STABILIZING A LASER

BACKGROUND OF THE INVENTION

The laser has achieved widespread use in many applications. Particularly, the semiconductor laser is extensively employed in optical communication systems as a means for transmitting modulated light signals via fiber optic cables or similar devices.

The diode laser employs a semiconductor where the electron current flowing across a junction between p and n type material produces extra electrons in the conduction band. These electrons radiate upon their making a transistion back to the valence band or to a lower energy state. If the junction current is large enough, a population inversion occurs and lasing is provided. To use this effect, a semiconductor crystal is polished with two parallel faces perpendicular to the junction plane. The amplified waves may then propogate across the plane of the junction and are reflected back and forth at the surfaces. The diode lasers are relatively small and in many applications require a great deal of power in order to provide the lasing effect.

Many prior art applications employ feedback loops to control and monitor the amount of power applied to the laser in an attempt to obtain a more efficient and constant output and in an attempt to further reduce power requirements. Examples of suitable prior art can be made by referring to U.S. Pat. No. 3,633,124 entitled LASER WITH FEEDBACK CIRCUIT FOR CONTROLLING RELAXATION OSCILLATION issued on Jan. 4, 1972. Other patents such as U.S. Pat. No. 3,898,583 entitled LASER STABILIZING TECHNIQUE show the power control of a laser by means of feedback circuity. This and other patents as U.S. Pat. Nos. 3,946,335; 3,641,459 and 3,996,526 show various other techniques for limiting and controlling the amount of power applied to a laser.

As above indicated, an important application for the laser is the use of the same in a communications system to provide at an output, a light modulated signal. Hence, there are also various techniques shown in the prior art which employ circuitry to modulate the output of a laser. Examples of suitable techniques occur in some of the above noted references, while further references such as U.S. Pat. No. 3,925,735 entitled MODULATION APPARATUS WITH SEMICONDUCTOR DEVICE issued on Dec. 9, 1975 is indicative of one type of technique to control the modulation of a laser.

In any event, in most of these techniques, modulation is performed by applying a prebias signal to the laser. Modulation is then applied to the laser, having the prebias, by various means. By employing a prebias, one can obtain relatively high speed operation; which high speed operation is accomplished by relatively high power dissipation. Hence, it can be indicated that the speed of operation is proportional to the amount of power consumed.

A particularly widespread application for the semiconductor laser involves the transmission of coded information over fiber optic cables. In this application, the laser is modulated according to the information to be transmitted over a fiber optic cable. Due to the nature of the transmission characteristics of fiber optic cables, a DC balanced code is employed. This code is used in such transmissions as there is difficulty in transmitting DC levels over fiber optic cables. The use of such codes creates a problem in regard to a laser feedback system. The problem manifests itself in regard to the balanced code and if the code or the input signal to the laser becomes imbalanced, the feedback causes the drive current to the laser to increase. This effect can result in damage and destroy the laser. In such systems, as the light intensity increases due to the operation of the feedback circuit, the increase in drive current can cause facet damage to the laser crystal.

It is therefore an object of the present invention to provide apparatus which will operate in conjunction with a laser diode to protect the laser in the event of a duty cycle imbalance. This object is accomplished while providing modulation control of a semiconductor laser diode while eliminating a prebias of the laser and hence acheiving a substantial power advantage over the prior art devices.

BRIEF DESCRIPTION OF THE PREFERRED EMBODIMENT

Stabilizing apparatus for controlling the output radiation from a laser modulated according to an input signal optimumly possessing a balanced duty factor, in combination therewith of apparatus for deenergizing said laser when said input signal deviates from said balanced duty factor, comprising means responsive to said input signal to develop an output control signal indicative of the duty factor of said input signal, and means coupled to said laser responsive to said control signal for substantially reducing current conduction of said laser when said control signal is of a predetermined value indicative of said duty factor falling below an acceptable margin.

DETAILED DESCRIPTION OF THE INVENTION

Figure 1:
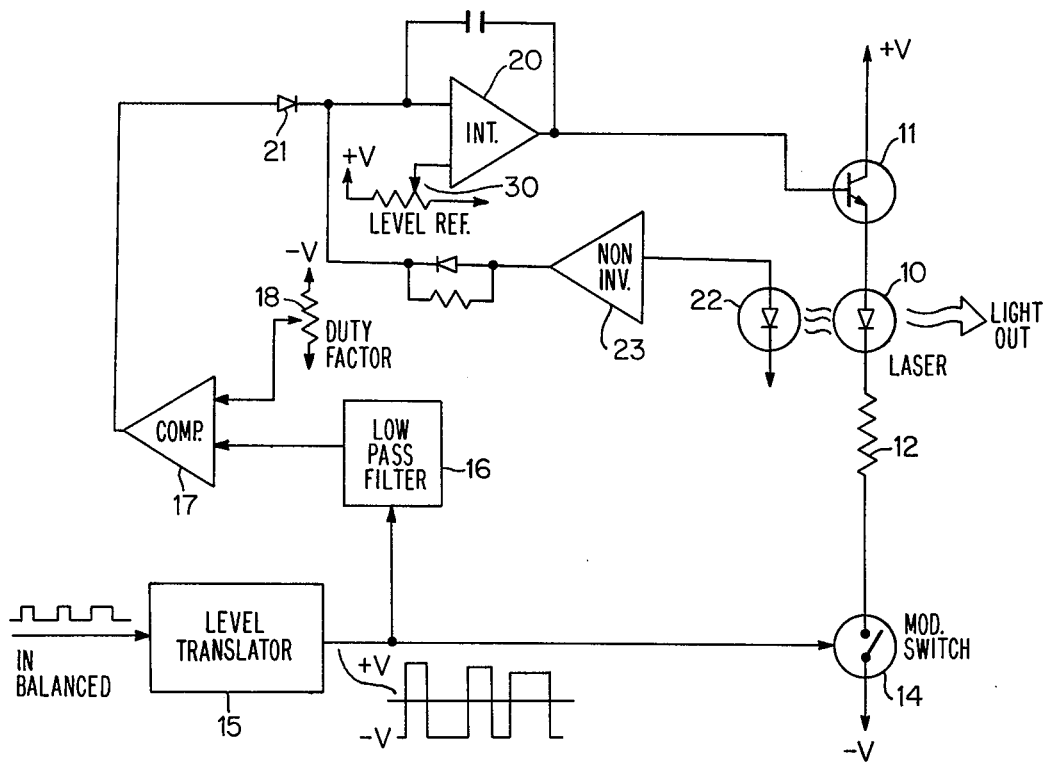
FIG. 1 is a simple block diagram partially in schematic form of a laser stabilizing apparatus according to this invention.

Referring to FIG. 1, there is shown a schematic diagram of a laser stabilizing circuit according to this invention. A semiconductor laser 10 has its anode coupled to the emitter of an emitter follower transistor amplifier 11. The emitter follower has its collector electrode coupled to a source of operating potential +V. The cathode of the laser diode is coupled through a current control resistor 12 to a semiconductor switch 14. The switch 14 has its controllable arm coupled to a source of operating potential designated as −V. Essentially, the switch 14 is controlled in operation by the output of a level translator circuit 15.

As shown in FIG. 1, the switch 14 can be selectively opened or closed, thus functioning to turn the laser diode on or off by interrupting the current flow through the diode. The switch 14, as indicated, is a semiconductor switch and may be a silicon controlled rectifier, a transistor configuration, or any other suitable switch capable of being operated on or off by means of a suitable input signal.

The level translator 15 receives an input signal as shown on the diagram which essentially employs a balanced duty factor or restricted spectrum type code. Such codes as applied to the input of the level translator 15 have the property that the integral of the time which the signal spends in the "1" or the on state is equal to the integral of the time spent in the "0" or off state. The input signal of such a duty cycle is applied to the input of the level translator 15. The level translator 15 converts the input signal to an inverted bipolar signal. Essentially, in this signal as used to control the switch 14, a "1" is denoted as $+V$, while a "0" is denoted as $-V$. As one can ascertain, since $+V$ equals $-V$, the integral of the signal with a proper code input will be zero volts.

Coupled to the output of the level translator is a low pass filter 16. The low pass filter 16 has its output coupled to one input of a comparator circuit 17. The other input of the comparator circuit 17 is coupled to the controllable arm of a reference potentiometer 18. The potentiometer is set to determine a duty cycle level for the feedback loop. The comparator 17 may be an operational amplifier device and operates to detect any duty cycle imbalance in the incoming code which causes the duty factor to drop below the allowable margin as specified by the setting of the potentiometer 18.

The low pass filter 16 filters the low frequency components of the input signal to thereby provide at its output, a signal consisting of low frequency components and indicative of the duty cycle of the input signal. As is known, a low pass filter will provide at its output, a signal containing an average value which will not be zero if the input signal is not a balanced signal as described.

The output of the comparator is coupled to an input of an integrator circuit 20 via a diode 21. Another input to the integrator 20 is obtained through a diode 22. The detector diode 22 is optically coupled to the laser diode and provides a signal proportional to the light intensity output of the laser diode 10.

The detector 22 may comprise a PIN detector which is operated in a low level photovoltaic mode. The output signal of detector 22 is applied to the input of an operational amplifier 23 operating in a noninverting mode. This signal is applied as a feedback control signal to an input of the operational integrator 20. The integrator 20 develops a voltage control signal for the laser which is responsive to the integral of the error or difference between the level reference as specified by control potentiometer 30 and the amplified feedback signal via amplifier 23. The output of the integrator 20 is coupled to the base electrode of the emitter follower 11 and hence, controls the amount of current that can flow through the laser diode 10.

Essentially, the feedback loop which consists of the detector 22, the amplifier 23 and the integrator 20 operates to control the current through the laser 10 during normal operation and to provide a suitable light output during the modulation process. If there is a predetermined imbalance in the duty cycle of the incoming code, the low pass filter 16 and the comparator 17 will cause the command integrator 20 to reverse bias the laser diode 10, thus preventing facet damage.

The reason for the duty factor error circuit described is as follows:

If a malfunction occurred in the system previous to the transmitter, one could generate a narrow duty factor signal at the output of the level translator. The control loop, including detector 22 responds to average power and therefore a signal from this loop would cause the integrator to provide a larger output signal in order to increase the drive to the laser diode 10. If one proceeded to overdrive the laser diode 10, damage to the diode would occur. The same exact problem would occur if the incoming data signal were interrupted for a period of time and then restored. In order to prevent this from occuring, the duty factor circuit including the low pass filter 16 and the comparator 17 serves to turn the laser off and thus prevent facet damage.

As will be subsequently explained, if a large error signal is presented and results in an overdrive, the laser will also be turned off. It is understood that the above described circuit employs a laser diode operating without a prebias and even though the circuit is not particularly suitable for high speed operation, one achieves a substantial power efficiency over such prebiasing devices and hence, the total operation results in substantial power savings. This aspect is particularly important for use with battery operated circuitry as by modulating and controlling a laser as above described, one can employ battery operation over an extended period of time as compared to those devices employing a prebiasing scheme.

Figure 2:
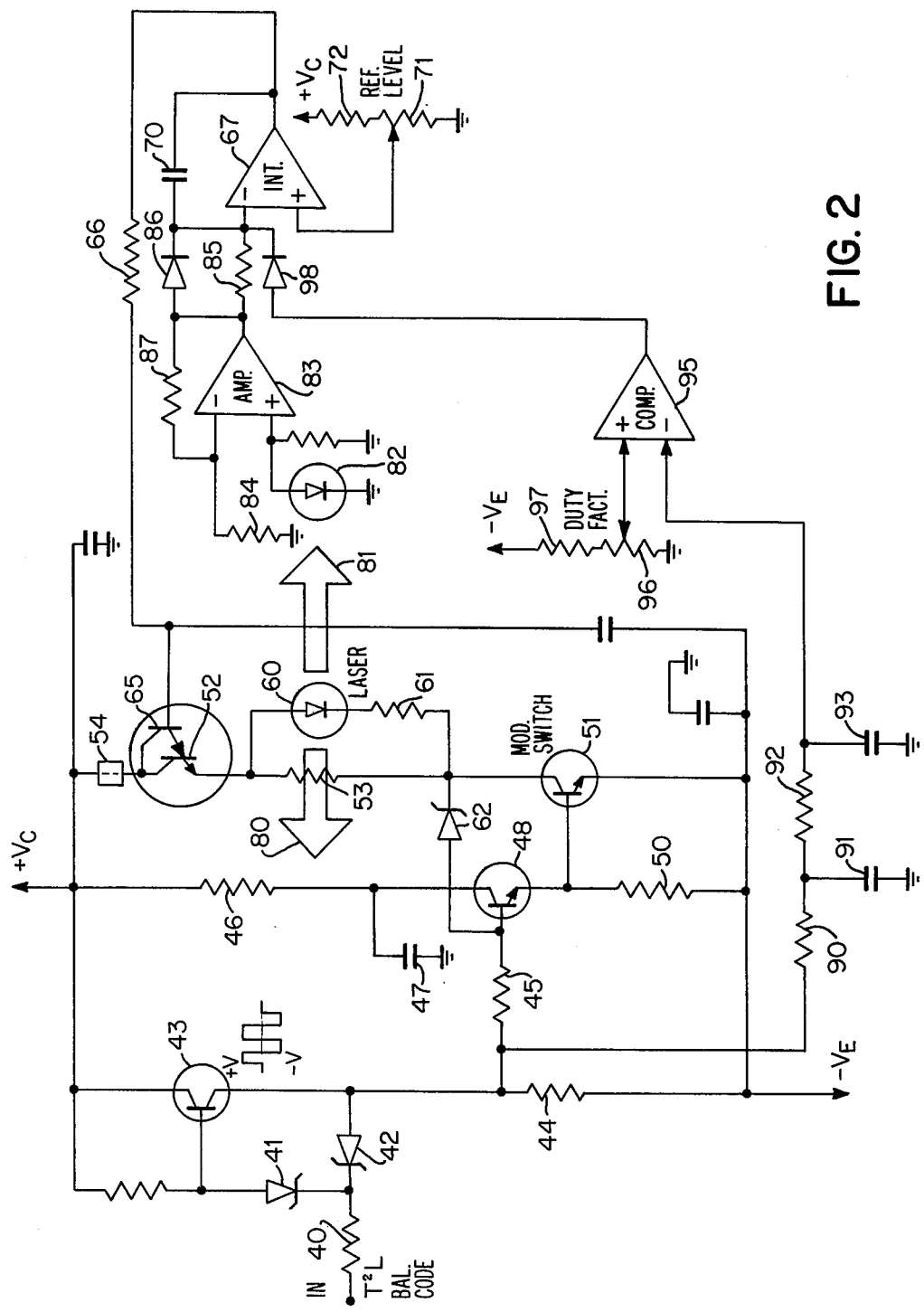
FIG. 2 is a detailed circuit schematic of apparatus as depicted in FIG. 1.

Referring to FIG. 2, there is shown a more detailed schematic diagram of a laser stabilizing technique of the type specified in FIG. 1. The input signal is applied to one terminal of a resistor 40. The input signal is indicated as a $T^2L$ balance code input. In this particular notation, a "0" is indicated as a signal level approximately equal to or less than 0.6 volts, while a "1" is approximately equal to or greater than 3 volts. As previously indicated, the signal is a balanced signal and hence, possesses the property that the integral of the time which the signal is in the "1" state is equal to the integral of the time in which the signal is in the "0" state.

The other terminal of resistor 40 is applied to the connection between the cathodes of two Shottky diodes 41 and 42. The diodes are used to prevent saturation storage charge in the translator driver circuit employing the pnp transistor 43. The anode of diode 41 is coupled to the base electrode of transistor 43, while the anode of diode 42 is coupled to the collector electrode of transistor 43. The emitter electrode of transistor 43 is coupled to the source of operating potential $+Vc$. The collector electrode of transistor 43 is coupled via a resistor 44 to a source of negative operating potential designated as $-Ve$.

The output at the collector electrode of the level translator transistor 43 provides a signal which varies between $+V$ and $-V$ as described in conjunction with FIG. 1 as an inverted bipolar signal. This signal is applied to the base electrode of a transistor 48 via a resistor 45. Transistor 48 is arranged in a common collector configuration and has its collector electrode coupled to the $+Vc$ reference supply via a resistor 46. A capacitor 47 is coupled from the collector electrode of transistor 48 to ground to provide AC bypass. The emitter electrode of transistor 48 is coupled to the $-Ve$ supply via a resistor 50 and is further coupled to the base electrode of a transistor 51. The collector electrode of transistor 51 is coupled to the emitter electrode of a transistor 52 via a resistor 53. The transistor 52 forms the output stage of a Darlington configuration and has its collector electrode coupled to the $+Vc$ supply via a ferrite bead 54. The function of the ferrite bead is to reduce high frequency transients at the collector electrode of the Darlington configuration and any inductance of a sufficient magnitude to do so will suffice.

In parallel with resistor 53 is the laser diode 60. Diode 60 has its anode coupled to the emitter electrode of transistor 52 and its cathode coupled via resistor 61 to the collector electrode of transistor 51. A diode 62 is coupled between the collector electrode of transistor 51 and the base electrode of transistor 48. The diode 62 provides voltage feedback and stabilization for the transistor amplifier circuit consisting of transistors 48 and 51. An input transistor 65 comprises the other half of the Darlington circuit and hence, has its collector electrode coupled to the collector electrode of transistor 52 with its emitter electrode coupled to the base electrode of transistor 52. The base electrode of transistor 65 is coupled via resistor 66 to the output of an operational amplifier 67 arranged in an integrator configuration and serving as the command integrator. The output of operational amplifier 67 is coupled via the series capacitor 70 to the inverting input of the amplifier 67. This configuration employing capacitor feedback in an operational amplifier specifies an integral mode. The noninverting input of amplifier 67 is coupled to the control arm of a level reference potentiometer 71 which forms part of a voltage divider with resistor 72 as coupled to the positive potential source. In this manner, the setting of resistor 71 specifies a level reference for the command integrator to be used to develop an error signal at the output of amplifier 67.

The laser diode 60 as shown in the circuit has the current through the device controlled by means of the Darlington configuration consisting of transistors 52 and 65 and has its cathode returned through the collector to emitter path of transistor 51. The laser diode 60 is equipped with a fiber on each end of its light emitting channel. Essentially, the two fibers will normally couple approximately equal levels of optical power. If there is a significant difference in these levels, the stronger level is the output fiber and is depicted generally by the arrow 80, while the weaker level is the feedback fiber and is depicted generally by the arrow 81.

Optically coupled to the feedback fiber 81 is the PIN diode detector 82. The detector 82 has its cathode coupled to a point of reference potential and has its anode coupled to the noninverting input of an operational amplifier 83. As indicated, the amplifier 83 operates in a noninverting mode and has its inverting input coupled to a point of reference potential via a resistor 84. The output of amplifier 83 is coupled to the inverting input of the command integrator 67 via a resistor 85 in shunt with a diode 86. The diode 86 has its anode coupled to the output of amplifier 83 and its cathode coupled to the inverting input of amplifier 67. A feedback resistor 87 is coupled between the output of amplifier 83 and the inverting input of amplifier 83. Resistors 84 and 87 specify the gain of the amplifier 83 as is known in the art.

Thus, as one can ascertain, the detector diode 82, amplifier 83 and the integrating amplifier 67 as controlling the conduction of the Darlington amplifier, comprises the main portions of the feedback loop and operate to develop a voltage control for the laser which is responsive to the differences of the level reference signal and the amplified feedback signal. This circuit, therefore, operates to assure that the normal operating power as supplied to the laser is controlled within predetermined limits. If a significant error signal is developed, diode 86 becomes forward biased and will reduce the output of the integrator 67 to thereby turn the laser diode 60 off to prevent damage due to large error signals as indicative of intense light output from the laser diode 60.

The above described circuitry is analgous to the feedback loop of FIG. 1 consisting of the detector 22, amplifier 23, integrator 20 and the follower 11.

The duty cycle control is also implemented in FIG. 2 by means of a low pass filter which essentially includes two RC stages coupled in series. Hence, there is shown a resistor 90 having one terminal coupled to the collector electrode of the level translator transistor 43. The other terminal of resistor 90 is coupled to ground via a capacitor 91, thus forming the first stage of the low pass filter. Another resistor 92 is coupled between the junction of resistor 90 and capacitor 91 to a terminal of another capacitor 93 having its other terminal coupled to a point of reference potential and thus forming the second stage of the low pass filter. The junction between resistor 92 and capacitor 93 is coupled to the inverting input of an operational amplifier 95 arranged in a comparator configuration. The noninverting input of amplifier 95 is coupled to the control arm of a reference potentiometer 96. Potentiometer 96 has one terminal coupled to a point of reference potential and the other terminal coupled via a resistor 97 to the negative reference supply $-Ve$. In this manner, the potentiometer 96 can be adjusted to specify a level at which the amplifier 95 will conduct and indicative of the duty cycle imbalance of the incoming code. The output of the comparator 95 is coupled via a diode 98 to the inverting input of the integrator 67. Hence, as seen from FIG. 2, if the duty cycle of the incoming code drops below the level specified by potentiometer 96, the comparator 95 will conduct, thus forward biasing diode 98. This causes the integrator to reverse bias the Darlington configuration to substantially reduce the amount of current flow in the laser diode 60 thus preventing increased current conduction.

During normal operation, the output of comparator 95 is extremely low for proper duty cycles and hence, diode 98 does not conduct. If the duty factor falls below the predetermined value, the diode 98 will conduct to turn the laser diode 60 off and thus prevent facet damage. The diode 86 which shunts resistor 85 also serves in rapid damping if a large error signal is developed at the output of amplifier 83. For such a large error signal, the diode 86 will conduct to similarly reduce the amount of current through the laser diode 60 to thus turn off the laser diode 60 in the event of an extremely large error signal.

Various other components exist in the schematic diagram of FIG. 2 and have not been particularly described as their use and application are relatively conventional.

There has been described a stabilizing technique for a laser diode. The stabilizing technique operates in conjunction with an input signal having a balanced duty factor and the diode is modulated according to the input signal so that it is either fully conducting or fully off definitive of a "1" or a "0". If the input duty cycle becomes imbalanced, a low pass filter acting in combination with a comparator detects the imbalance and operates to terminate conduction of the laser diode to thus prevent facet damage. A further control loop operates to stabilize the current through the laser diode during normal operation and provides an output control signal which is a function of light intensity to thereby provide optimum operation of the laser diode during normal operation. If an extremely large error signal is produced by this feedback loop, the laser is also turned off, even though the duty cycle of the incoming signal may be proper.

What is claimed is:

1. Stabilizing apparatus for controlling the output radiation from a laser modulated according to an input signal optimumly possessing a balanced duty factor, in combination therewith of apparatus for deenergizing said laser when said input signal deviates from said balanced duty factor, comprising:

means responsive to said input signal to develop an output control signal indicative of the duty factor of said input signal, and means coupled to said laser and responsive to said control signal for substantially reducing current conduction of said laser when said control signal is of a predetermined value indicative of said duty factor falling below an acceptable margin.

2. The stabilizing apparatus according to claim 1 wherein said laser is a semiconductor laser diode modulated according to said input signal by conducting current during the presence of a first logic level and ceasing conduction during the presence of a second logic level.

3. The stabilizing apparatus according to claim 1 wherein said means responsive to said input signal includes a low pass filter having an input terminal responsive to said input signal and an output terminal for providing only the low frequency components of said input signal.

4. The stabilizing apparatus according to claim 3 further including a comparator circuit having a first input coupled to said output terminal of said low pass filter and a second input coupled to a reference source indicative of a permissible range of low frequency components to provide at an output, a control signal indicative of said duty factor falling below said acceptable margin.

5. The stabilizing apparatus according to claim 1 further including:

means optically coupled to said laser to provide at an output, a signal proportional to the light intensity of said laser, means for comparing said signal with a predetermined reference signal to provide another control signal according to any difference between said light intensity signal and said reference signal, and means for applying said other control signal to said laser to control said output light radiation according to said other control signal.

6. Stabilizing apparatus for use with a semiconductor laser diode, comprising in combination:

current modulation means coupled to said laser diode and operative to control the current through said diode to turn said diode on or off in response to an input signal, translator means having an input terminal adapted to receive a balanced duty factor signal and an output terminal for providing a bipolar signal, with said output terminal coupled to said modulation means for turning said diode on or off in response to said bipolar signal, first control means including detector means optically coupled to said diode to provide a first control signal indicative of the light intensity output of said laser second control means including comparator means operative to monitor said bipolar signal to provide a second control signal when the duty cycles of said bipolar signal and therefore said input signal falls below an acceptable margin, common control means having an output coupled to said laser for controlling the output thereof, said common control means having first and second inputs for respectively receiving said first and second control signals, to substantially reduce conduction of said laser when said light intensity exceeds a predetermined value as determined by either said first or second control means.

7. The stabilizing apparatus according to claim 6 wherein said common control means includes an operational amplifier integrator configuration having an output coupled to said laser diode and a first input responsive to said first control signal and a second input responsive to said second control signal.

8. The stabilizing apparatus according to claim 6 wherein said second control means includes a low pass filter having an input adapted to receive said bipolar signal for providing an output signal mainly comprising low frequency components indicative of an imbalance in duty cycle for application of said output signal to said comparator.

9. The stabilizing apparatus according to claim 6 wherein said detector means included in said first control means includes a PIN diode operating in a low level photovoltaic mode.

10. The stabilizing apparatus according to claim 6 wherein said current modulation means includes a voltage follower transistor configuration having a collector to emitter path in series with said laser diode, with a control base electrode coupled to said output of said common control means for controlling the current through said diode strictly according to said first and second control signals.

* * * * *